(12) United States Patent
Hiraoka

(10) Patent No.: US 8,139,374 B2
(45) Date of Patent: Mar. 20, 2012

(54) ELECTRONIC DEVICE HAVING ELECTRICALLY CONNECTING STRUCTURE

(75) Inventor: Yoshiaki Hiraoka, Yokohama (JP)

(73) Assignee: Kyocera Corporation, Kyoto (JP)

(*) Notice: Subject to any disclaimer, the term of this patent is extended or adjusted under 35 U.S.C. 154(b) by 351 days.

(21) Appl. No.: 12/412,178

(22) Filed: Mar. 26, 2009

(65) Prior Publication Data

US 2010/0079967 A1 Apr. 1, 2010

(30) Foreign Application Priority Data

Mar. 28, 2008 (JP) .................................. 2008-085978

(51) Int. Cl.
H05K 1/11 (2006.01)
(52) U.S. Cl. ............... 361/803; 361/679.01; 361/755; 361/800; 361/814; 455/575.1; 455/575.3; 439/165
(58) Field of Classification Search ............ 361/600–818, 361/679.28; 455/296, 300–301; 174/375, 174/396
See application file for complete search history.

(56) References Cited

U.S. PATENT DOCUMENTS

| | | | | |
|---|---|---|---|---|
| 6,011,699 A | * | 1/2000 | Murray et al. | 361/814 |
| 6,700,784 B2 | * | 3/2004 | Huang et al. | 361/715 |
| 6,982,880 B2 | * | 1/2006 | Takagi | 361/814 |
| 7,050,293 B2 | * | 5/2006 | Arbisi et al. | 361/679.3 |
| 2004/0246667 A1 | * | 12/2004 | Maskatia et al. | 361/683 |
| 2005/0213307 A1 | * | 9/2005 | Pan | 361/749 |
| 2006/0146488 A1 | * | 7/2006 | Kimmel | 361/681 |

FOREIGN PATENT DOCUMENTS

| | | |
|---|---|---|
| JP | 06082784 U | 11/1994 |
| JP | 2000-138522 | 5/2000 |
| JP | 2006174137 A | 6/2006 |

OTHER PUBLICATIONS

Japanese language office action dated May 28, 2010 and its English language translation for corresponding Japanese application 2008085978 lists the references above.

* cited by examiner

Primary Examiner — Angel R Estrada
Assistant Examiner — Dimary Lopez
(74) Attorney, Agent, or Firm — DLA Piper LLP (US)

(57) ABSTRACT

An electronic device is provided which makes it possible to reduce noise generated from a signal line around a connecting portion connecting a first body and a second body. The connecting portion has a first metallic portion. A first circuit board provided in the first body and a second circuit board provided in the second body. The signal line that electrically connects the first circuit board and the second circuit board via the connecting portion, in which the signal line is wound around the first metallic portion.

6 Claims, 14 Drawing Sheets

ELECTRONIC DEVICE HAVING ELECTRICALLY CONNECTING STRUCTURE

The present application claims foreign priority based on Japanese Patent Application No. 2008-085978 filed on 28 Mar. 2008, the content of which is incorporated herein by reference in its entirety.

BACKGROUND OF THE INVENTION

1. Field of the Invention

The present invention relates to an electronic device such as a cellular phone device that is configured by connecting a plurality of bodies via a connecting portion.

2. Related Art

A conventionally known configuration as an electronic device such as a cellular phone device consists of a first body, a second body, and a connecting portion for connecting the first body and the second body. For example, in Japanese Unexamined Patent Application, First Publication No. 2000-138522, a first circuit board disposed in the first body and a second circuit board disposed in the second body are electrically connected by a signal line going through the connecting portion. The signal line consists of, for example, a thin coaxial cable.

The signal line is likely to generate noise around the connecting portion of the first body and the second body. The reason for this is that, in recent electronic devices, functionality has been expanded, the number of electronic parts mounted to a circuit board has increased, and an increasing amount of signals flow between the first body and the second body. As a result, the noise generated from the signal line around the connecting portion tends to increase.

SUMMARY OF THE INVENTION

An object of the present invention is to provide an electronic device that makes it possible to reduce the noise generated from the signal line around the connecting portion connecting the first body and the second body.

The electronic device of the present invention is provided with a first body; a second body; a connecting portion which connects the first body and the second body, and which has a first metallic portion; a first circuit board disposed in the first body; a second circuit board disposed in the second body; and a signal line that electrically connects the first circuit board and the second circuit board via the connecting portion, in which the signal line is wound around the first metallic portion.

Furthermore, it is preferable for the signal line to be wound around the first metallic portion via an intermediate member.

In addition, it is preferable for the first metallic portion to be electrically connected to a reference potential portion.

Moreover, it is preferable for at least a portion of the intermediate member to consist of a magnetic material.

Additionally, it is preferable for the first body and the second body to be connected via the connecting portion so as to be openable and closable, and to include an antenna that is disposed to at least one of the first body and the second body, and a second metallic portion, which is disposed to at least one of the first body and the second body, and which is disposed so as to be capacitively coupled to the first metallic portion in a state in which the first body and the second body are opened via the connecting portion. Further, it is preferable for the first metal member to be a shaft center member in the connecting portion, and for the signal line to be wound around the shaft center member via a covering member that covers a peripheral face of the shaft center member, thereby forming a coil. Moreover, preferably provided are a reference potential portion disposed in at least one of the first body and the second body, and a conductive portion that electrically connects the reference potential portion and the shaft center member.

DETAILED DESCRIPTION OF THE INVENTION

Embodiments of the present invention are hereinafter described with reference to the accompanying drawings. First, a basic structure of a cellular phone device, which is the first embodiment of the electronic device of the present invention, is described with reference to FIGS. 1 to 4.

Figure 1:
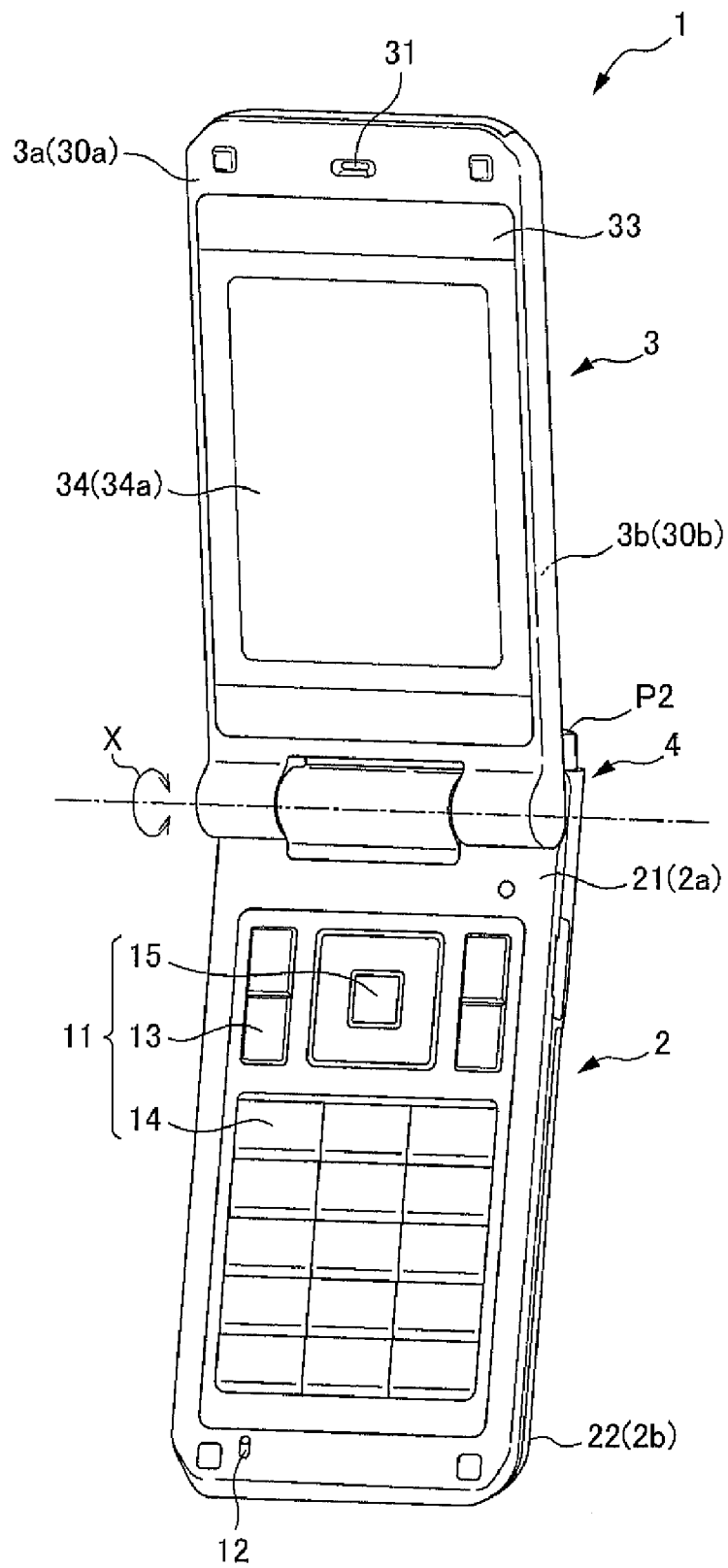
FIG. 1 is a perspective view showing a cellular phone device according to the first embodiment of the present invention in an opened state.
Figure 2:
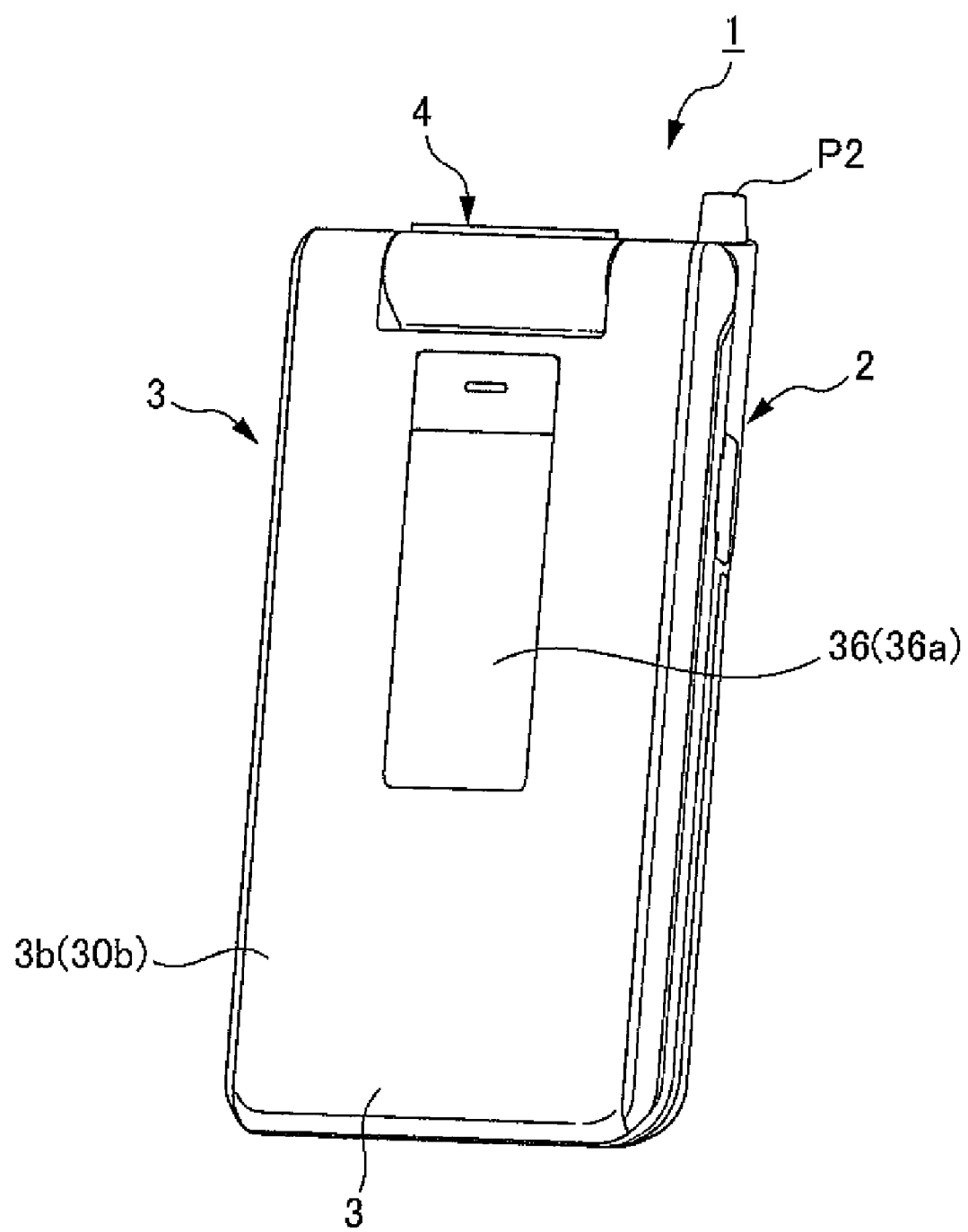
FIG. 2 is a perspective view showing a cellular phone device according to the first embodiment of the present invention in an closed state.
Figure 3:
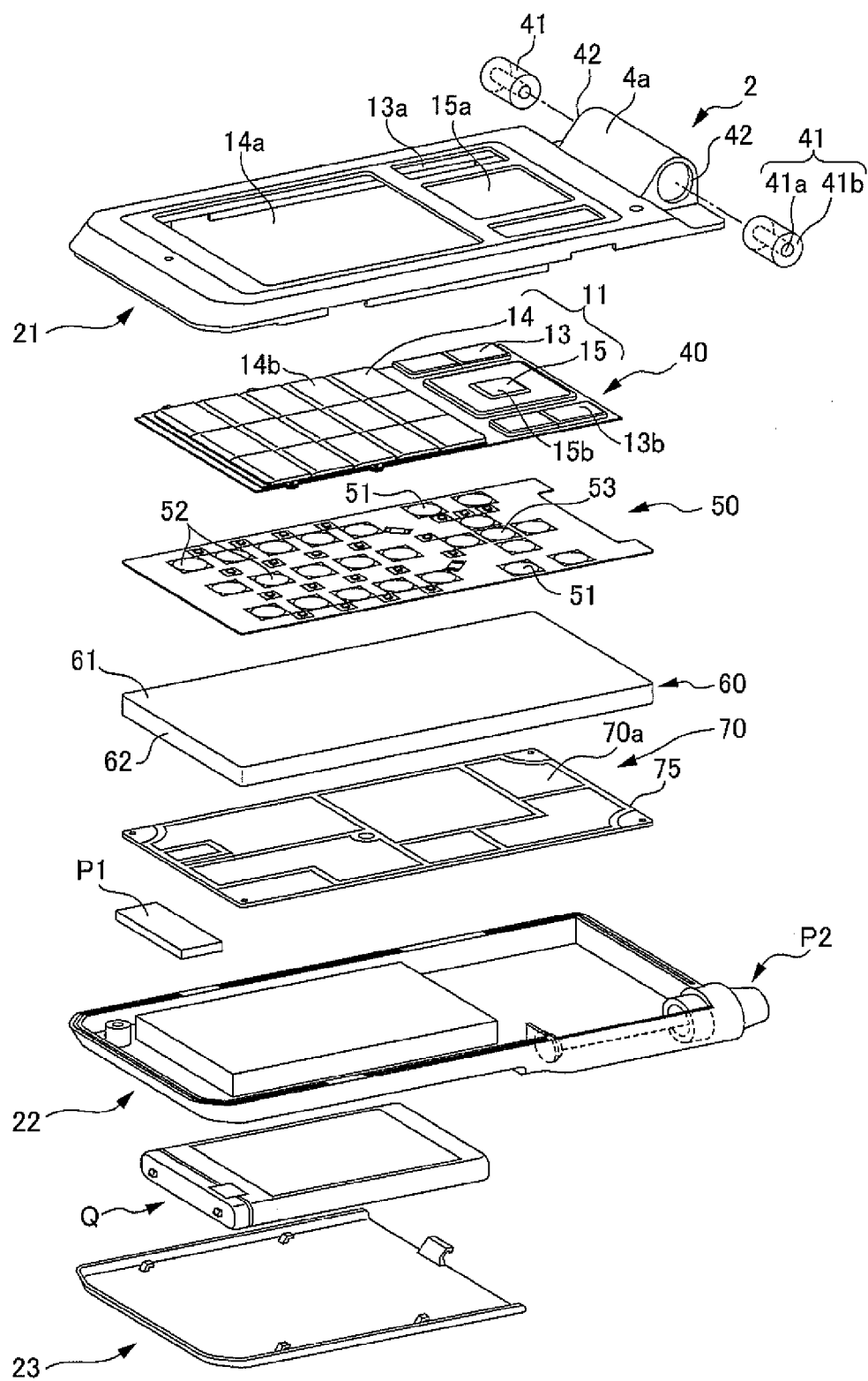
FIG. 3 is an exploded perspective view of members that are built into an operation unit side body shown in FIG. 1.
Figure 4:
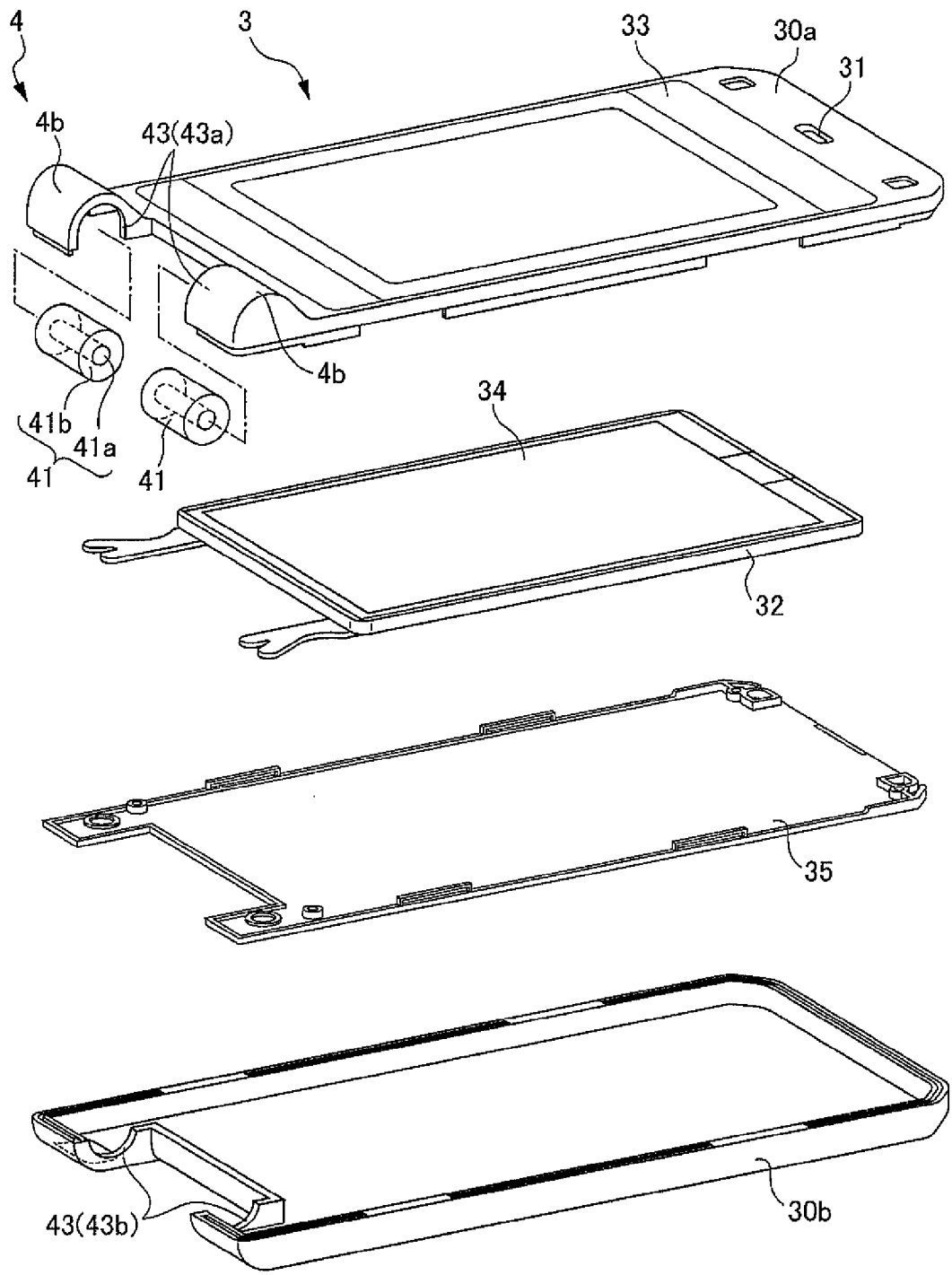
FIG. 4 is an exploded perspective view of members that are built into a display unit side body shown in FIG. 1.

FIG. 1 is a perspective view showing the cellular phone device 1 according to the first embodiment in an opened state. FIG. 2 is a perspective view showing the cellular phone device 1 according to the first embodiment in a closed state. FIG. 3 is an exploded perspective view of members that are built into an operation unit side body 2 shown in FIG. 1. FIG. 4 is an exploded perspective view of members that are built into a display unit side body 3 shown in FIG. 1.

As shown in FIGS. 1 and 2, the cellular phone device 1 of the first embodiment is provided with the operation unit side body 2 as a first body and the display unit side body 3 as a second body. The operation unit side body 2 and the display unit side body 3 are connected via a connecting portion 4 provided with a hinge mechanism so as to be openable and closable around an opening-and-closing axis X. More specifically, an upper end portion of the operation unit side body 2 and a lower end portion of the display unit side body 3 are connected via the connecting portion 4. As a result, the cellular phone device 1 is configured so as to make it possible to relatively move the operation unit side body 2 and the display unit side body 3 connected via the connecting portion 4.

In other words, the cellular phone device 1 is configured so as to enable changing between a state (an opened state) shown in FIG. 1 in which the operation unit side body 2 and the display unit side body 3 are opened via the connecting portion 4 and a state (a closed state) shown in FIG. 2 in which the operation unit side body 2 and the display unit side body 3 are folded via the connecting portion 4 and mutually superimposed. Here, the closed state is a state in which the bodies 2 and 3 are disposed so as to be mutually superimposed, and the opened state is a state in which the bodies 2 and 3 are disposed so as not to be mutually superimposed or so as to reduce the extent of superimposing of the bodies 2 and 3.

As shown in FIGS. 1 and 2, an outer surface of the operation unit side body 2 is configured with a front case 21 and a rear case 22. The operation unit side body 2 is configured such that an operation key group 11 and a sound input unit 12 are exposed on the side of the front case 21, in which the sound input unit 12 serves as a microphone to which the sound of the user of the cellular phone device 1 is input when conversing.

The operation key group 11 is configured with function setting operation keys 13 for operating various settings and various functions such as an address book function and a mail function; input operation keys 14 for inputting telephone numbers and characters and the like for mail and the like; and a selection operation key 15 as an operation member for performing selections in various operations and scrolling in up-down and left-right directions.

A predetermined function is assigned to each of the keys constituting the operation key group 11 (key assignment), depending on an opened or closed state of the operation unit side body 2 and the display unit side body 3 as well as various modes, or types of an application or the like that is activated. When the user depresses each key, an operation corresponding to a function assigned to each key is executed.

The sound input unit 12 is disposed on an outer end portion side that is opposite to the connecting portion 4 side in the longitudinal direction of the operation unit side body 2. In other words, the sound input unit 12 is disposed in one outer end portion side in the opened state of the cellular telephone device 1.

An interface (not shown) for performing communication with external devices (e.g., a host device) is disposed on a lateral face of one side of the operation unit side body 2. A side key, to which a predetermined function is assigned, and an interface (not shown) with which external memory is inserted and removed are disposed on a lateral face of another side of the operation unit side body 2. Each interface is covered with a cap when not in use.

A main display unit 34a for displaying a variety of information and a sound output unit 31 as a receiver for outputting sound of the other party of the conversation are disposed so as to be exposed on the front case 30a in the display unit side body 3.

The cellular phone device 1 has a plurality of functions. The cellular telephone device 1 has, for example, a terrestrial digital broadcast reception control function, an AM radio broadcast reception control function, an FM radio broadcast reception control function, a main power supply control function (on/off control function), and the like.

Next, an internal structure of the operation unit side body 2 and the display unit side body 3 is described with reference to FIG. 3. As shown in FIG. 3, the front case 21 and the rear case 22 are disposed such that concave inner faces thereof face each other, and are connected such that peripheries thereof are mutually superimposed. Moreover, the key structure unit 40, the optical switch substrate 50, the shielding case 60, and the main circuit board 70 as the first circuit board are assembled internally so as to be interposed between the front case 21 and the rear case 22.

Key holes 13a, 14a and 15a are formed as openings in the front case 21 on the inner surface facing the main display unit 34a of the display unit side body 3 in a state in which the cellular phone device 1 is closed (or folded). Push surfaces of function setting operation key members 13b constituting the function setting operation keys 13, push surfaces of input operation key members 14b constituting the input operation keys 14, and a push surface of a selection operation key member 15b constituting the selection operation key 15 are exposed from the key holes 13a, 14a and 15a, respectively. By depressing any of the push surfaces of the function setting operation key members 13b, the push surfaces of the input operation key members 14b, and the push surface of the selection operation key member 15b, which are exposed in this way, a top of a metal dome (shaped like a bowl) described later, which is provided to each of corresponding key switches 51, 52 and 53, is depressed, and a switch terminal is contacted, and electrically conducts.

The key substrate 50 is a flexible substrate that is formed by interposing wiring between a plurality of insulating layers (insulating films). The key substrate 50 is provided with the plurality of key switches 51, 52 and 53 as key tops on the side of the key structure portion 40, each corresponding to the function setting operation keys 13, the input operation keys 14, and the selection operation key 15, respectively. Each of the key switches 51, 52 and 53 (to be described later) has a metal dome made of a metal plate that is three-dimensionally formed by being curved like a bowl. The metal dome is configured such that, when a top of the bowl shape is depressed, a switch terminal formed on an electrical circuit (not shown) printed on the surface of the key substrate 50 is contacted, thereby performing electrical conduction.

The key structure portion 40 is disposed to be layered on the key substrate 50, and is configured by providing depressing elements capable of depressing the plurality of key switches 51, 52 and 53, and key tops having operation faces, to a sheet constituted of silicon and the like having elasticity.

The key structure portion 40 is configured by sticking, with an adhesive, the key tops of the operation key group 11 to the surface of a base substrate sheet made of silicon rubber. The function setting operation keys 13, the input operation keys 14, and the selection operation key 15, which constitute the operation key group 11 in the key structure portion 40, are disposed in positions respectively facing the key switches 51, 52 and 53 in the key substrate 50, and are disposed so as to be respectively exposed from the key holes 13a, 14a and 15a that are formed in the front case 21.

The shielding case 60 is an electrically-conductive member having a shape in which one broad surface of a thin rectangular parallelepiped is opened. The shielding case 60 is provided with a flat plate portion 61 on which the key substrate 50 is placed, and ribs 62 that are formed to be substantially perpendicular to the opened surface of the flat plate portion 61. The ribs 62 are formed so as to have a height that is equivalent to, or sufficiently higher than, a height of the highest electronic part among various electronic parts mounted to the main circuit board 70. Ribs 62 are formed at the periphery and inside of the flat plate portion 61 so as to correspond to the reference potential patterned layer 75 (to be described later in detail) constituting a reference potential portion in the main circuit board 70. More specifically, the ribs 62 are formed so as to be disposed on the reference potential patterned layer 75 in a state in which the shielding case 60 is placed on the main circuit board 70.

It should be noted that the entirety of the shielding case 60 can be configured from metal. Moreover, it is also possible to configure the shielding case 60 by forming a conductive film on a surface of a skeleton formed of resin.

Moreover, since the key substrate 50 is placed on the flat plate portion 61 of the shielding case 60, pressure and deformation due to depression of the key structure portion 40 are not likely to be transmitted to the main circuit board 70 disposed under the shielding case 60.

Bottom faces of the ribs 62 abut to the reference potential patterned layer 75, thereby electrically connecting the shielding case 60 to the reference potential patterned layer 75. The shielding case 60 has an electric potential that is as high as the reference potential patterned layer 75 by being electrically connected to the reference potential patterned layer 75.

The shielding case 60 suppresses effects of noise, such as high frequencies from the outside, on various electronic parts disposed on the circuit board 70. Moreover, the shielding case 60 shields noise that is emitted from an RF (Radio Frequency) circuit, a CPU circuit, a power supply circuit and the like, thereby suppressing effects of the noise on the other electronic parts, a receiver circuit connected to the antenna, and the like. More specifically, by positioning the bottom faces of the ribs 62 in the shielding case 60 on the reference potential patterned layer 75, each circuit is surrounded by the ribs 62 and covered by a part of the flat plate portion 61. The ribs 62 function as a barrier plate in each circuit, and shield each circuit in collaboration with a portion of the flat plate portion 61.

Various electronic parts and circuits (not shown) are disposed on the main circuit board 70. The various electronic parts form a plurality of circuit blocks by way of a predetermined combination. For example, various circuit blocks including an RF (Radio Frequency) circuit, a power supply circuit and the like are formed.

In addition to the aforementioned various electronic parts, the reference potential patterned layer 75 constituting the reference potential portion is formed on a first surface 70a of the main circuit board 70 to the side of the shielding case 60. The reference potential patterned layer 75 is formed so as to divide each of the aforementioned circuit blocks. The reference potential patterned layer 75 is formed by printing conductive members in a predetermined pattern on the first surface 70a of the main circuit board 70.

A main antenna P1 is configured by disposing an antenna element of a predetermined shape on the base. The main antenna P1 is disposed to an end portion side that is opposite to the connecting portion 4 in the operation unit side body 2. The antenna element of the main antenna P1 is formed of a belt-shaped sheet metal. Moreover, electrical power is fed to the main antenna P1 from the main circuit board 70 via a feed terminal (not shown). As a result, electrical power is fed to the antenna element from the main circuit board 70 via the feed terminal, and the antenna element is connected to the RF module and the like of the main circuit board 70.

A TV receiving antenna P2 receives radio waves of so-called one-segment broadcasting as terrestrial digital broadcasting. The TV receiving antenna P2 is extractably provided to the operation unit side body 2.

A removable battery lid 23 is provided to one end portion side of the rear case 22. The battery lid 23 is mounted to the rear case 22 after accommodating the battery Q from the outside of the rear case 22. Moreover, a microphone (not shown) of the sound input unit 12 for inputting sound of the user is accommodated in one end portion side of the rear case 22.

Next, an internal structure of the display unit side body 3 is described with reference to FIG. 4 and the like.

As shown in FIG. 4, the display unit side body 3 is provided with a front case 30a, a sound output unit 31, a front panel 33, a main liquid crystal module 34 for displaying various information, a display unit side circuit board 32 connected to the main liquid crystal module 34, a rear panel 35, and a rear case 30b.

The external surface of the display unit side body 3 is mainly configured with the front case 30a and the rear case 30b. Describing in detail, as shown in FIGS. 1 and 4, the front face 3a of the display unit side body 3 is mainly configured with the front case 30a and the front panel 33. The front face 3a is a face facing the operation unit side body 2 in the closed state of the cellular phone device 1. As shown in FIGS. 2 and 4, a rear face 3b of the display unit side body 3 is mainly configured by the rear case 30b. The rear face 3b is a face opposite to the front face 3a.

In the display unit side body 3, the front case 30a, the front panel 33, the main liquid crystal module 34, the display unit side circuit board 32, the rear panel 35 and the rear case 30b are disposed to be layered. More specifically, the front case 30a and the rear case 30b are disposed such that concave inner faces thereof face each other, and are connected such that peripheries thereof are mutually superimposed. The display unit side circuit board 32 connected to the main liquid crystal module 34 is internally assembled so as to be interposed between the front case 30a and the rear case 30b. The main liquid crystal module 34 is disposed such that the main display section 34a provided to one face thereof is exposed to the front face 3a of the display unit side body 3 from an opening formed in the front case 30a through the front panel 33 that is mainly a transparent portion. A speaker connected to an amplifier, both of which are not shown, is connected to the display unit side circuit board 32.

As shown in FIG. 2, a sub liquid crystal module 36 for displaying various information is disposed on the rear case 30b side of the display unit side body 3. The sub liquid crystal module 36 is disposed such that a sub display section 36a provided to one face thereof is exposed on the rear face 3b of the display unit side body 3 through the transparent portion of the rear case 30b.

The main liquid crystal module 34 and the sub liquid crystal module 36 are configured with liquid crystal panels respectively constituting the main display section 34a and the sub display section 36a; drive circuits for driving the liquid crystal panels; light sources such as a back light for irradiating light from the rear face side of the liquid crystal panels; and the like.

Moreover, a sound output unit 31, through which sound of the other party of the conversation is output, is provided in the front case 30a. The sound output unit 31 is disposed on an end portion side that is opposite to the connecting portion 4 in respect to the longitudinal direction of the display unit side body 3. In other words, the sound output unit 31 is disposed in the vicinity of the end portion of the display unit side body 3 side of the cellular phone device 1 in the opened state.

Moreover, a reference potential portion G2 (see FIGS. 8A and 8B), which is a second metallic portion, is disposed in the display unit side body 3. The reference potential portion G2 is a reference potential portion provided to the display unit side circuit board 32, which is a second circuit board. As described later, the reference potential portion G2 also functions as the second metallic portion, which is capacitively coupled to the shaft center members (the first metallic portion) 41a of the hinge shaft members 41 in the connecting portion 4 in the opened state of the cellular phone device 1.

Figure 5:
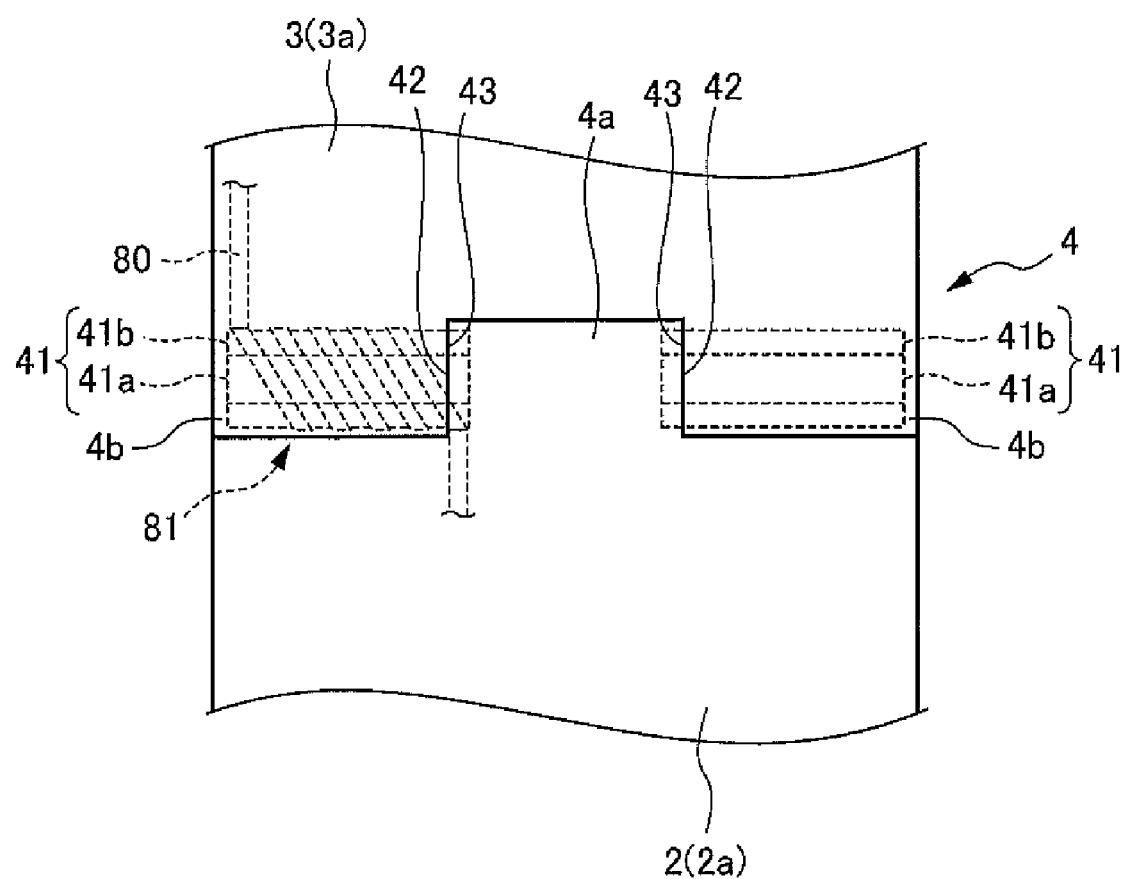
FIG. 5 is a schematic diagram partially showing the vicinity of a connecting portion of a cellular phone device according to the present invention in the opened state.
Figure 6:
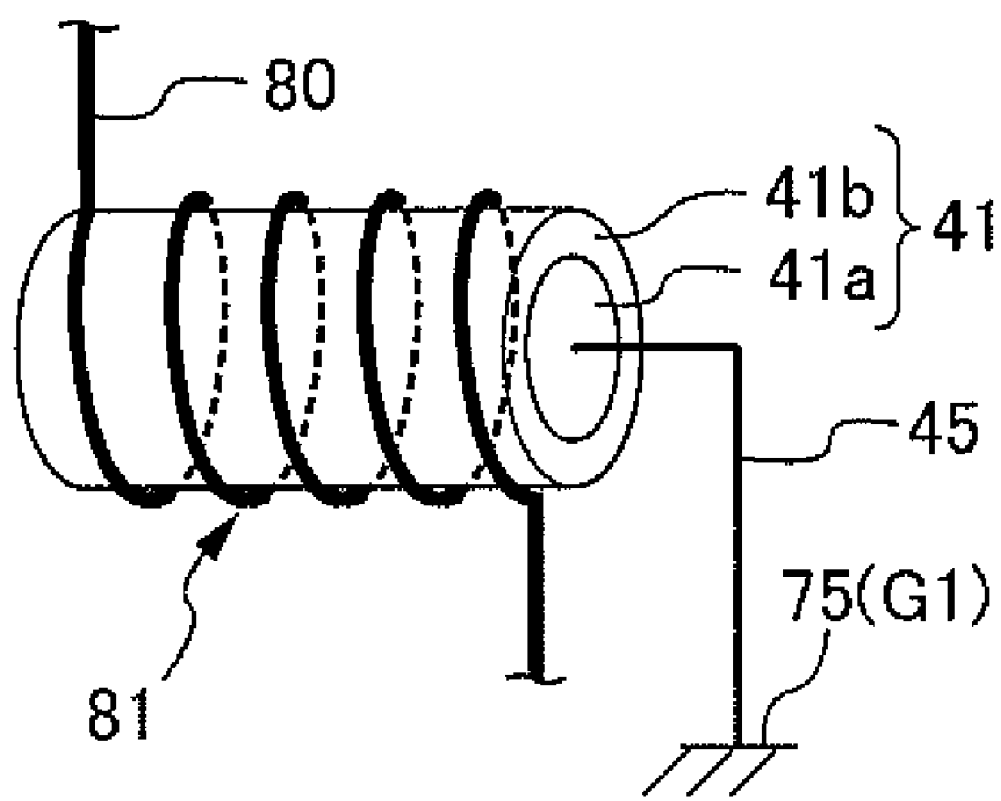
FIG. 6 is a perspective view schematically showing a state in which a signal line is wound around a hinge shaft member according to the present invention.
Figure 7:
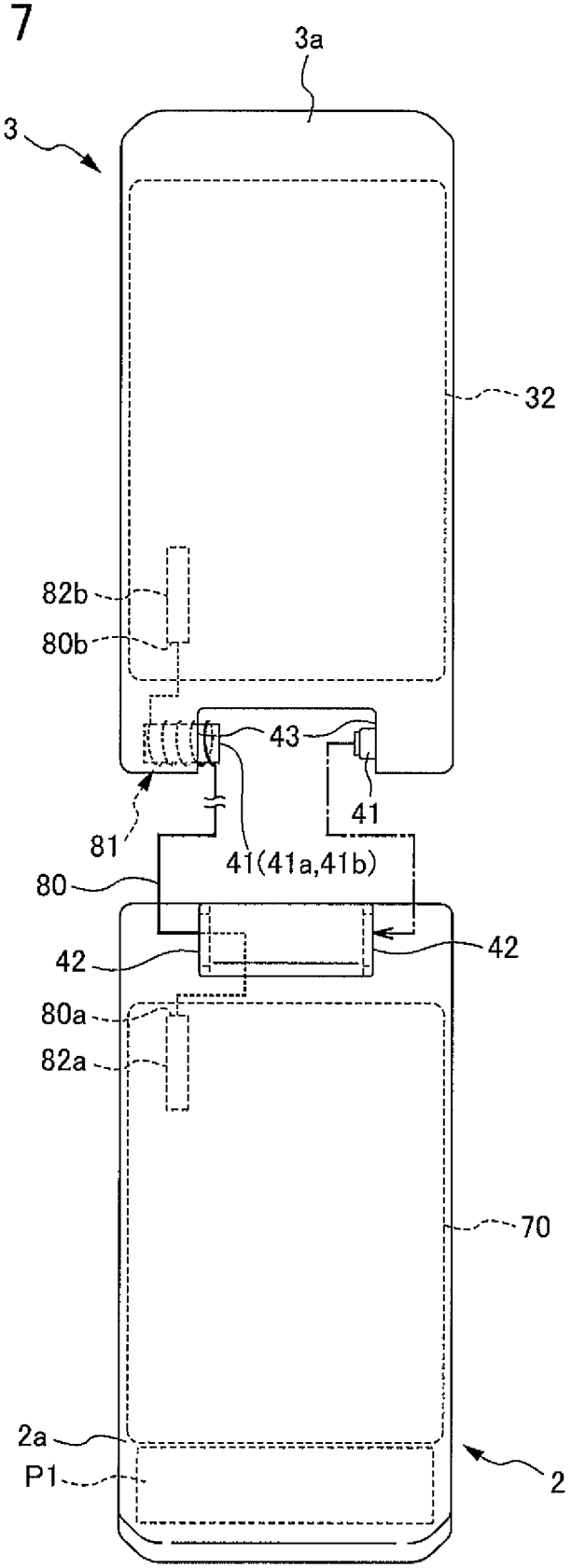
FIG. 7 is a diagram that shows an operation unit side body and a display unit side body of a cellular phone device according to the present invention in the opened state virtually separated.
Figure 8A:
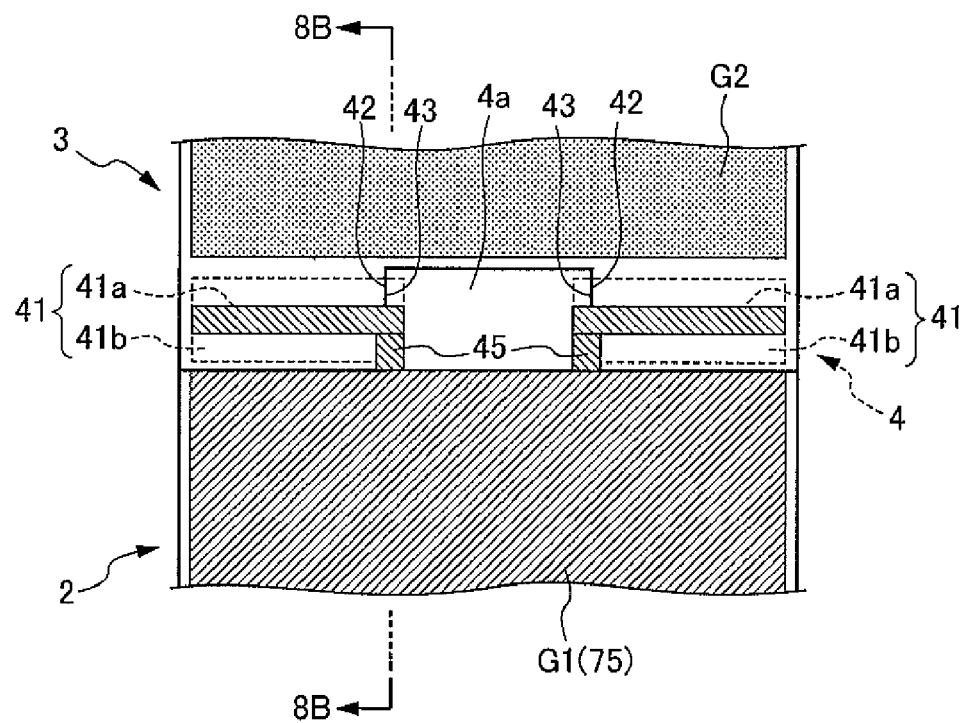
FIGS. 8A and 8B are diagrams schematically showing an electrical connecting relationship among the shaft center members, the reference potential portion of the operation unit side body, and the reference potential portion of the display unit side body, regarding the cellular phone device of the second embodiment according to the present invention in the opened state.
Figure 8B:
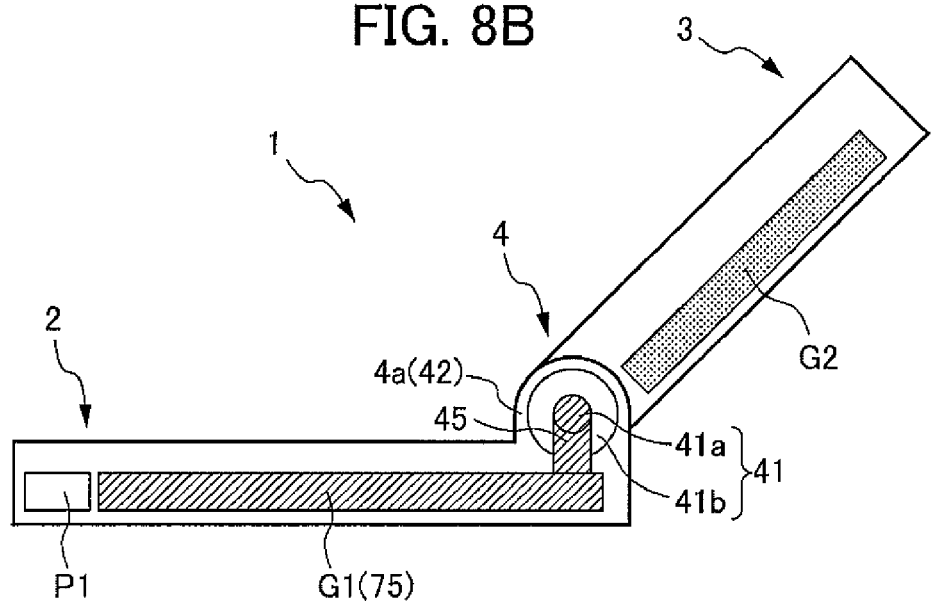

Next, the connecting portion 4 is described in detail with reference to FIGS. 3 to 8B. FIG. 5 is a schematic diagram partially showing the vicinity of the connecting portion 4 of the cellular phone device 1 in the opened state. FIG. 6 is a perspective view schematically showing a state in which the signal line 80 is wound around the hinge shaft member 41. FIG. 7 is a diagram that shows the operation unit side body 2 and the display unit side body 3 of the cellular phone device 1 in the opened state virtually separated. FIGS. 8A and 8B are diagrams schematically showing an electrical connecting relationship among the shaft center members 41a, the reference potential portion G1 of and operation unit side body 2, and the reference potential portion G2 of the display unit side body 3, regarding the cellular phone device 1 in the opened state. FIG. 8A is a partial diagram of the vicinity of the connecting portion 4 viewed from the thickness direction of the operation unit side body 2 and the display unit side body 3. FIG. 8B is a cross-sectional view along a line 8B-8B in FIG. 8A.

As shown in FIGS. 3 and 5, a bulge portion 4a, which bulges to the front face 2a side of the operation unit side body 2, is formed in the end portion in the operation unit side body 2 to the side of the display unit side body 3. The bulge portion 4a is provided in a central portion in the width direction in the operation unit side body 2. First shaft journal openings 42 and 42 are respectively provided to the outer sides of the bulge portion 4a in the width direction of the operation unit side body 2. The hinge shaft members 41 are respectively inserted and disposed into the first shaft journal openings 42. A pair of extension portions 4b and 4b (to be described later) in the display unit side body 3 is disposed to the sides to be further outside than the bulge portion 4a in the width direction of the operation unit side body 2.

As shown in FIGS. 4 and 5, the pair of extension portions 4b and 4b is provided to the end portion in the display unit side body 3 to the side of the operation unit side body 2. The pair of extension portions 4b and 4b is spaced apart from each other in the width direction of the display unit side body 3, and is positioned outside in the width direction of the display unit side body 3. The bulge portion 4a in the operation unit side body 2 is disposed between the pair of extension portions 4b and 4b.

Second shaft journal openings 43 and 43 are respectively provided to the inner sides of the pair of extension portions 4b and 4b in the width direction of the display unit side body 3. The second shaft journal openings 43 are formed with front-side semicircular portions 43a on the front case 30a side and rear-side semicircular portions 43b on the rear case 30b side. The hinge shaft members 41 are respectively inserted and disposed into the second shaft journal openings 43.

The pair of hinge shaft members 41 is inserted into the first shaft journal openings 42 and the second shaft journal openings 43, thereby configuring a hinge mechanism in the connecting portion 4.

As shown in FIG. 6, the hinge shaft member 41 consists of the shaft center member (first metallic portion) 41a and a covering member (intermediate member) 41b that covers a peripheral surface of the shaft center member 41a. In other words, the connecting portion 4 has the shaft center members 41a. The shaft center member 41a consists of a metal member that is columnar, cylindrical (hollow) or the like. It is preferable for at least a part of the covering member 41b to consist of a magnetic material. Ferrites are preferable as the magnetic material from the viewpoint that the relative permittivity is high.

As shown in FIG. 7, the main circuit board 70 in the operation unit side body 2 is electrically connected to the display unit side circuit board 32 in the display unit side body 3 by way of the signal line 80 through the connecting portion 4. In other words, the cellular phone device 1 is provided with the signal line 80 going through the connecting portion 4 for electrically connecting the main circuit board 70 and the display unit side circuit board 32. The signal line 80 consists of, for example, a thin coaxial cable.

One end portion 80a of the signal line 80 is connected to the main circuit board 70 in the operation unit side body 2 via a first connector 82a. Another end portion 80b of the signal line 80 is connected to the display unit side circuit board 32 in the display unit side body 3 via a second connector 82b.

The signal line 80 is wound around the hinge shaft member 41. In detail, the signal line 80 is wound around the shaft center member 41a via the covering member 41b, thereby forming a coil 81. When the signal line 80 is wound around the shaft center member 41a via the covering member 41b, the signal line 80 is likely to be capacitively coupled to the shaft center member 41a.

The shaft center members 41a of the hinge shaft members 41 are electrically connected to the reference potential portion. In the present embodiment, as shown in FIGS. 6, 8A and 8B, the shaft center members 41a are electrically connected to the reference potential patterned layer 75 (G1) in the main circuit board 70 via conductive portions 45. The conductive portions 45 are positioned in the vicinities of facing end portions in the pair of hinge shaft members 41 and 41.

It should be noted that, in FIGS. 8A and 8B, a reference numeral "G1" is assigned to the reference potential portion (reference potential patterned layer 75) in the operation unit side body 2, and a reference numeral "G2" is assigned to the reference potential portion in the display unit side body 3. In FIGS. 8A and 8B, the reference potential portion G1 in the operation unit side body 2 and the reference potential portion G2 in the display unit side body 3 are schematically shown.

The reference potential portion G2 in the display unit side body 3 also functions as the second metallic portion, which is capacitively coupled to the shaft center members 41a of the hinge shaft members 41 in the connecting portion 4. Therefore, in a state in which the shaft center members 41a and the reference potential portion G2 are capacitively coupled, when an incoming wave incoming by propagating through the air from a host device is resonated by the main antenna P1, a high-frequency current is induced, and an electric line of force is formed. The high-frequency current induced by the incoming wave is propagated from the main antenna P1 to the main circuit board 70, the signal line 80, and the display unit side circuit board 32, thereby forming a high frequency electrical ground.

Moreover, the incoming wave resonated by the main antenna P1 is propagated to the main circuit board 70, the conductive portion 45, the shaft center members 41a, and the reference potential portion G2 (display unit side circuit board 32), which is capacitively coupled to the shaft center members 41a, thereby forming a high frequency electrical ground. Furthermore, the incoming wave resonated by the main antenna P1 is propagated to the main circuit board 70, the conductive portion 45, the shaft center members 41a, the signal line 80 that is capacitively coupled to the shaft center members 41a, and the display unit side circuit board 32, thereby forming an high frequency electrical ground (RF ground).

According to the cellular phone device 1 of the present embodiment that has the aforementioned configuration, each of the following effects is achieved.

In the cellular phone device 1 of the present embodiment, the signal line 80 for electrically connecting the main circuit board 70 and the display unit side circuit board 32 via the connecting portion 4 is wound around the shaft center members 41a of the hinge shaft members 41. As a result, the coil 81 consisting of the signal line 80 is formed in the connecting portion 4, thereby increasing an inductance component of the signal line 80 in the vicinity of the connecting portion 4. Accordingly, it is possible to preferably reduce the noise generated from the signal line 80, which is likely to be a noise source.

Moreover, in the cellular phone device 1 of the present embodiment, the signal line 80 is wound around the covering members 41b via the shaft center members 41a. As a result, the signal line 80 and the shaft center members 41a are likely to be capacitively coupled, thereby making it possible to further reduce the noise generated from the signal line 80, which is likely to be a noise source.

Moreover, in the cellular phone device 1 of the present embodiment, the shaft center members 41a are electrically connected to the reference potential portion (e.g., the reference potential patterned layer 75 (reference potential portion G1) in the operation unit side body 2). As a result, when the signal line 80 and the shaft center members 41a are capacitively coupled, the noise generated from the signal line 80 is propagated to the reference potential portion. Therefore, it is possible to further reduce the noise generated from the signal line 80, which is likely to be a noise source.

Moreover, in the cellular phone device 1 of the present embodiment, since the covering members 41b consist of a magnetic material, the permittivity between the signal line 80 and the shaft center members 41a is improved. Due to this, the extent of the capacitive coupling between the signal line 80 and the shaft center members 41a is increased, a result of which it is possible to further reduce the noise generated from the signal line 80, which is likely to be a noise source.

Moreover, in the cellular phone device 1 of the present embodiment, the second metallic portion (the reference potential portion G2 in the operation unit side body 2) is disposed to be capacitively coupled to the shaft center members 41a in the opened state. As a result, the shaft center members 41a and the second metallic portion are capacitively coupled, thereby suppressing deterioration of antenna sensitivity in the opened state.

In particular, since the signal line 80 is wound around the shaft center members 41a via the covering members 41b consisting of a magnetic material, the magnetic material of the shaft center members 41a improves the permittivity between the shaft center members 41a and the second metallic portion. Thus, the extent of the capacitive coupling between the shaft center members 41a and the second metallic portion is increased, thereby making it possible to further suppress deterioration of antenna sensitivity in the opened state.

Moreover, the capacitive coupling between the reference potential patterned layer 75 (the reference potential portion G1) in the operation unit side body 2 and the reference potential portion G2 in the display unit side body 3 is strengthened, thereby making it possible to improve the gain of the antenna.

Furthermore, a state in which a high-frequency connection is made between the reference potential portions G1 and G2 is formed by capacitively coupling the reference potential portion G1 of the operation unit side body 2 and the reference potential portion G2 of the display unit side body 3. By reducing localization of a high-frequency current propagating through both the reference potential portions G1 and G2, it is possible to improve the gain of the antenna.

It should be noted that the principle to increase the degree of the capacitive coupling between the shaft center members 41a and the reference potential portions by conducting through the shaft center members 41a in the hinge shaft members 41 to the reference potential portions and by covering the shaft center members 41a with the covering members 41b consisting of a magnetic material is as follows. The capacitance is in proportion to an area of opposing metals and relative permittivity between the metals, and is inversely proportional to a distance between the opposing metals. In the present embodiment, the shaft center members 41a in the hinge shaft members 41 are conduct to the reference potential portions, thereby the reference potential portions G1 and G2 approach each other, and the distance between the metals is decreased. In addition, the shaft center members 41a are covered with the covering members 41b consisting of a magnetic material, thereby increasing the relative permittivity between the metals. Thus, the capacitance between the reference potential portions G1 and G2 is increased, and the extent of the capacitive coupling is strengthened.

Next, other embodiments of the present invention are described. Regarding the other embodiments, differences from the first embodiment are mainly described, the same reference numerals are assigned to the configurations similar to those in the first embodiment, and descriptions thereof are omitted. The descriptions regarding the first embodiment are appropriately applied to points that are not particularly described regarding the other embodiments. In the other embodiments, effects similar to those in the first embodiment are achieved.

A cellular phone device 1α of a second embodiment is described with reference to FIGS. 9 to 10B.

Figure 9:
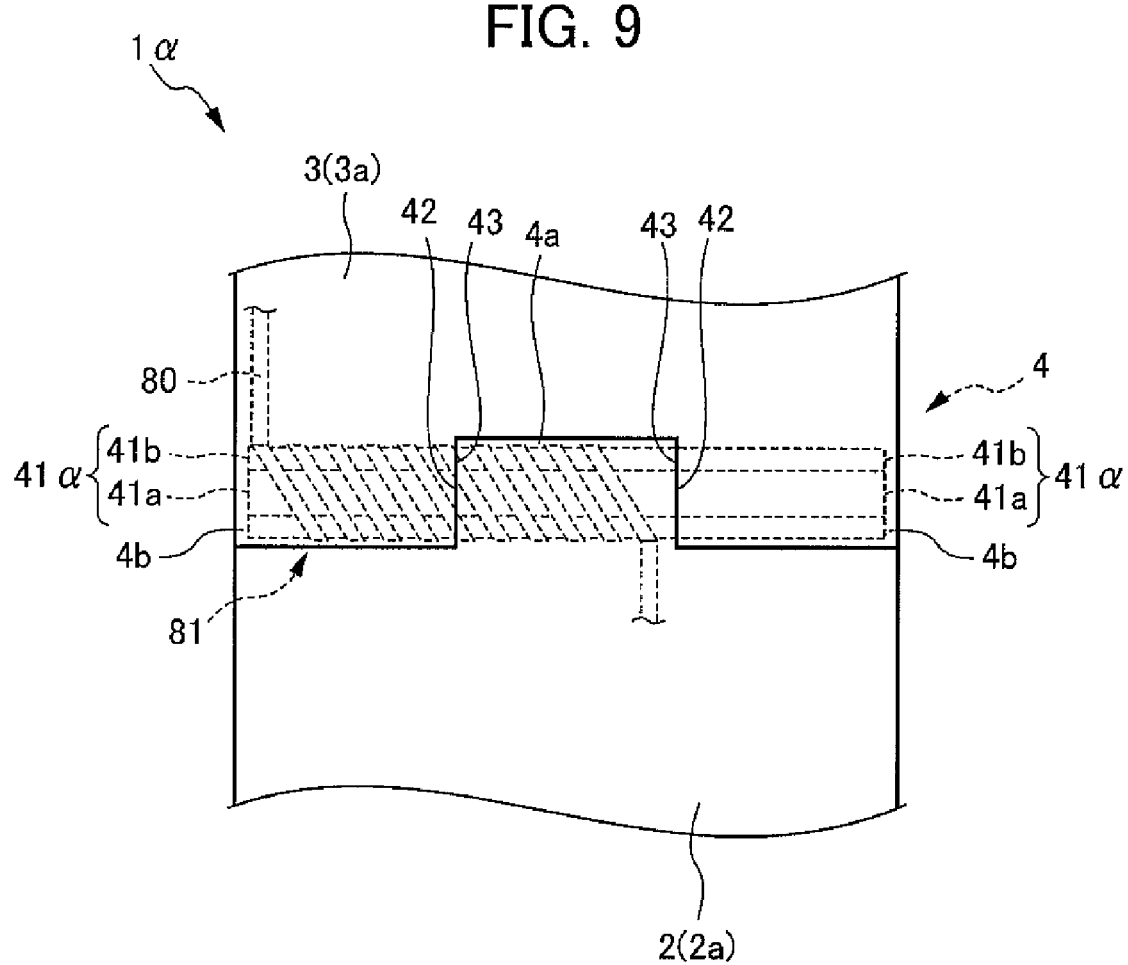
FIG. 9 is a schematic diagram partially showing the vicinity of a connecting portion of a cellular phone device of the second embodiment according to the present invention in the opened state.
Figure 10A:
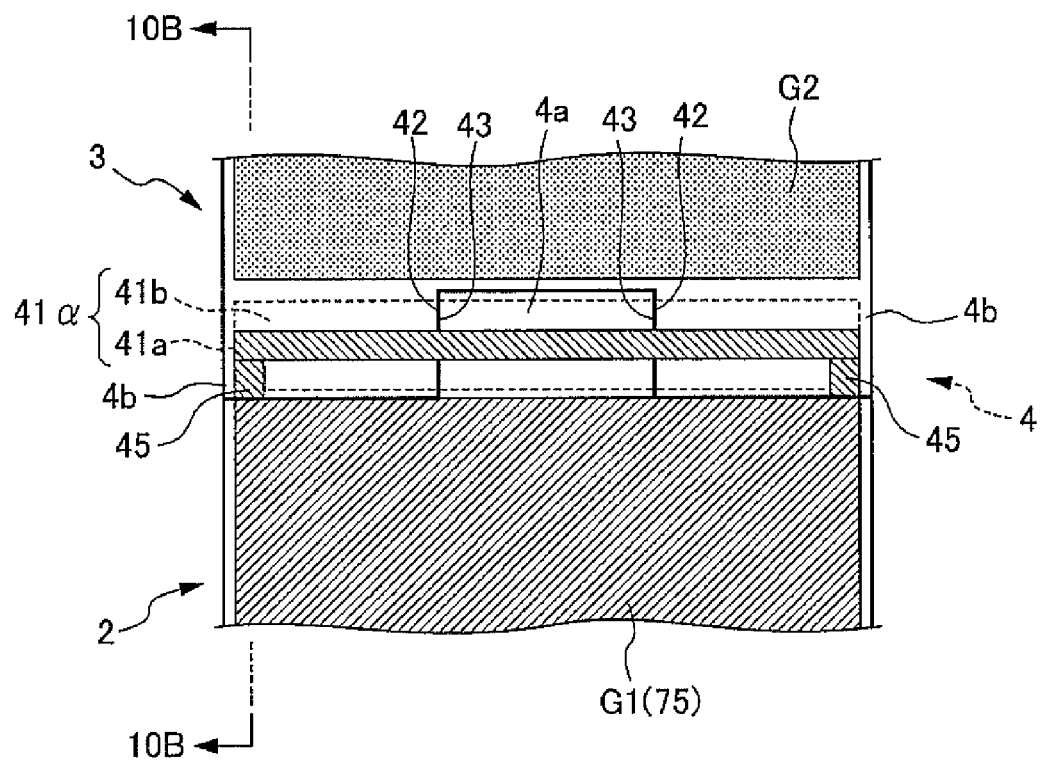
FIGS. 10A and 10B are diagrams schematically showing an electrical connecting relationship among the shaft center members, the reference potential portion of the operation unit side body, and the reference potential portion of the display unit side body, regarding the cellular phone device of the second embodiment according to the present invention in the opened state.

FIG. 9 is a schematic diagram partially showing the vicinity of the connecting portion 4 in the cellular phone device 1α of the second embodiment in the opened state (the diagram corresponding to FIG. 5). FIGS. 10A and 10B are diagrams schematically showing an electrical connecting relationship among the shaft center members 41a, the reference potential portion G1 of the operation unit side body 2, and the reference potential portion G2 of the display unit side body 3, regarding the cellular phone device 1α in the opened state (the diagrams respectively corresponding to FIGS. 8A and 8B). FIG. 10A is a partial diagram of the vicinity of the connecting portion 4 viewed from the thickness direction of the operation unit side body 2 and the display unit side body 3. FIG. 10B is a cross-sectional view along a line 10B-10B in FIG. 10A.

Figure 10B:
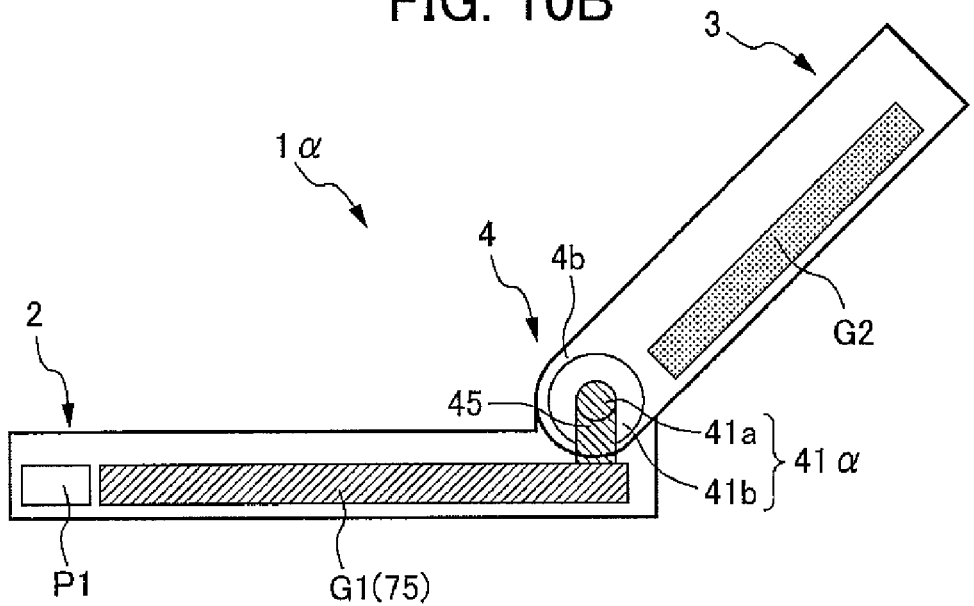

As shown in FIGS. 9, 10A and 10B, the cellular phone device 1α of the second embodiment is mainly different from the cellular phone device 1 of the first embodiment in that the hinge shaft member constituting the hinge mechanism of the connecting portion 4 is configured with one hinge shaft member 41α that penetrates the bulge portion 4a of the connecting portion 4. The other configurations are similar to those in the first embodiment.

As shown in FIGS. 9, 10A and 10B, in the cellular phone device 1α of the second embodiment, the hinge shaft member 41α has a length that extends for substantially the full width in the width direction of the operation unit side body 2 and the display unit side body 3. The conductive portions 45 are respectively disposed to the vicinities of both end portions of the hinge shaft member 41α. The coil 81 formed of the signal line 80 is formed in a range from the vicinity of one end portion in the hinge shaft member 41α to a position exceeding a center in the axial direction of the hinge shaft member 41α (end portion side in the width direction of the body).

In the cellular phone device 1α of the second embodiment as well, effects similar to those in the cellular phone device 1 of the first embodiment are achieved.

Next, a cellular phone device 1β of a third embodiment is described with reference to FIGS. 11 to 14B.

Figure 11:
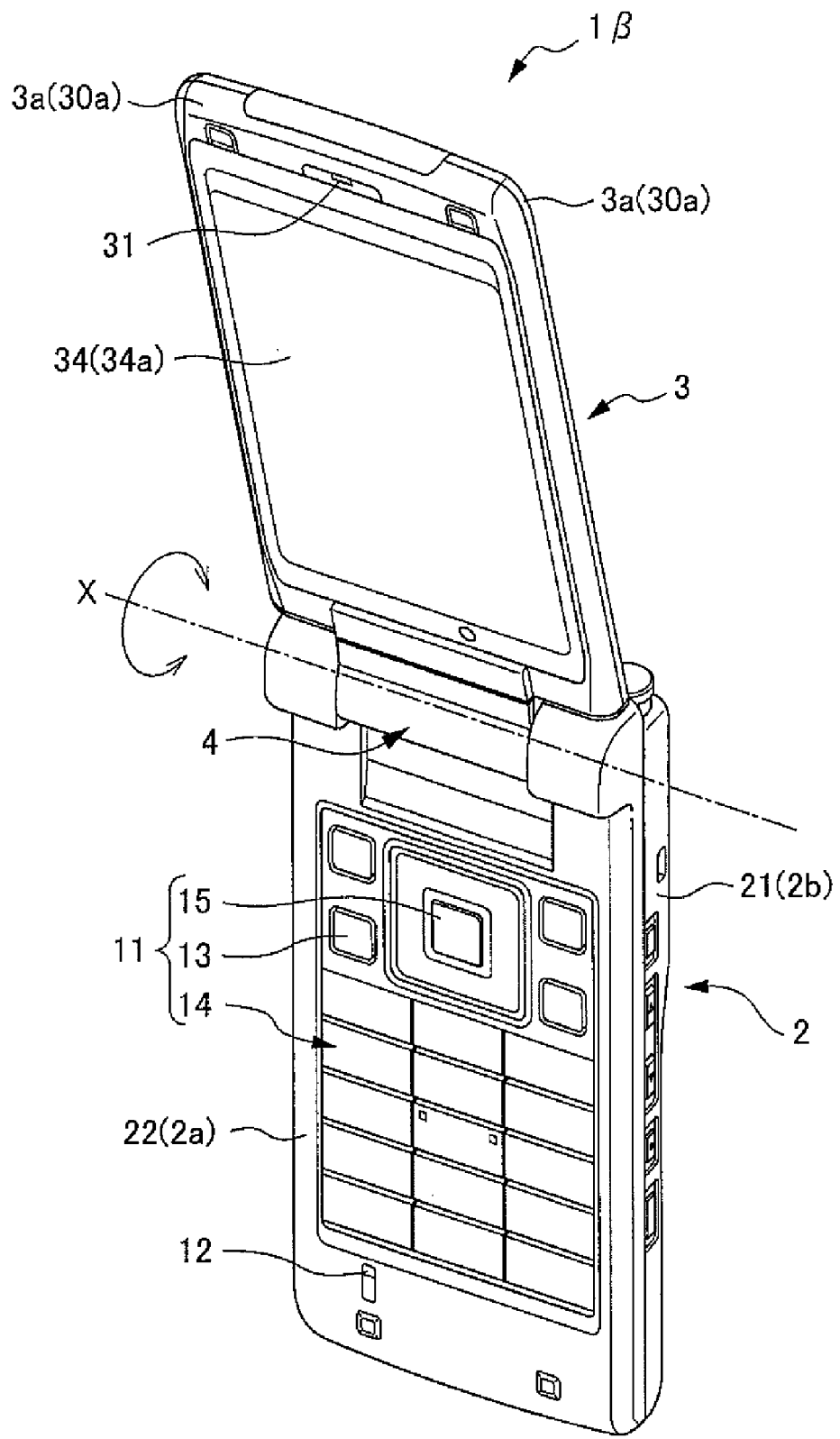
FIG. 11 is a perspective view showing a cellular phone device according to the third embodiment of the present invention in an opened state.
Figure 12:
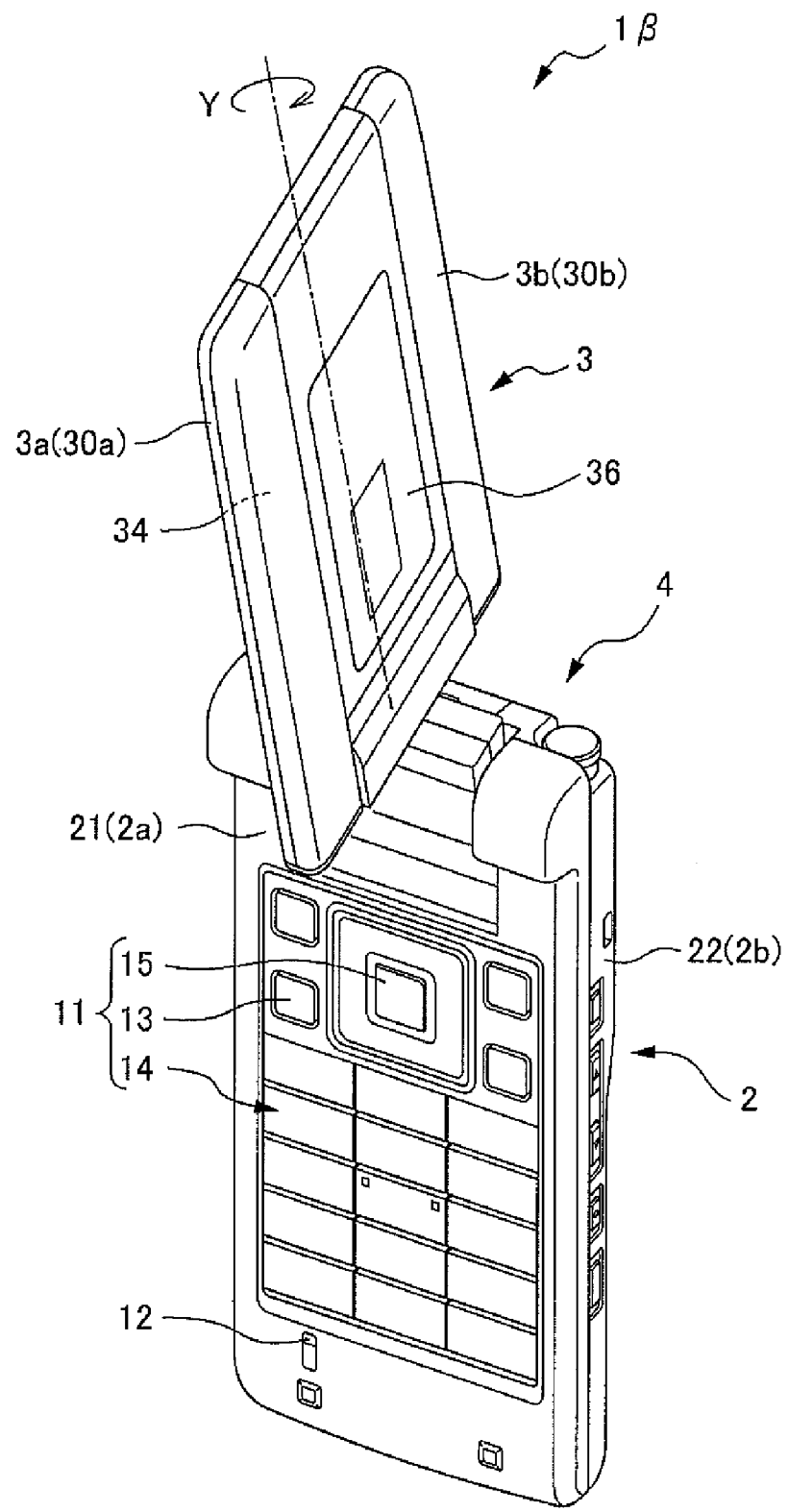
FIG. 12 is a perspective view of the cellular phone device shown in FIG. 11 in a state in which the display unit side body is pivoted at a predetermined angle around a pivot axis of the connecting portion.
Figure 13:
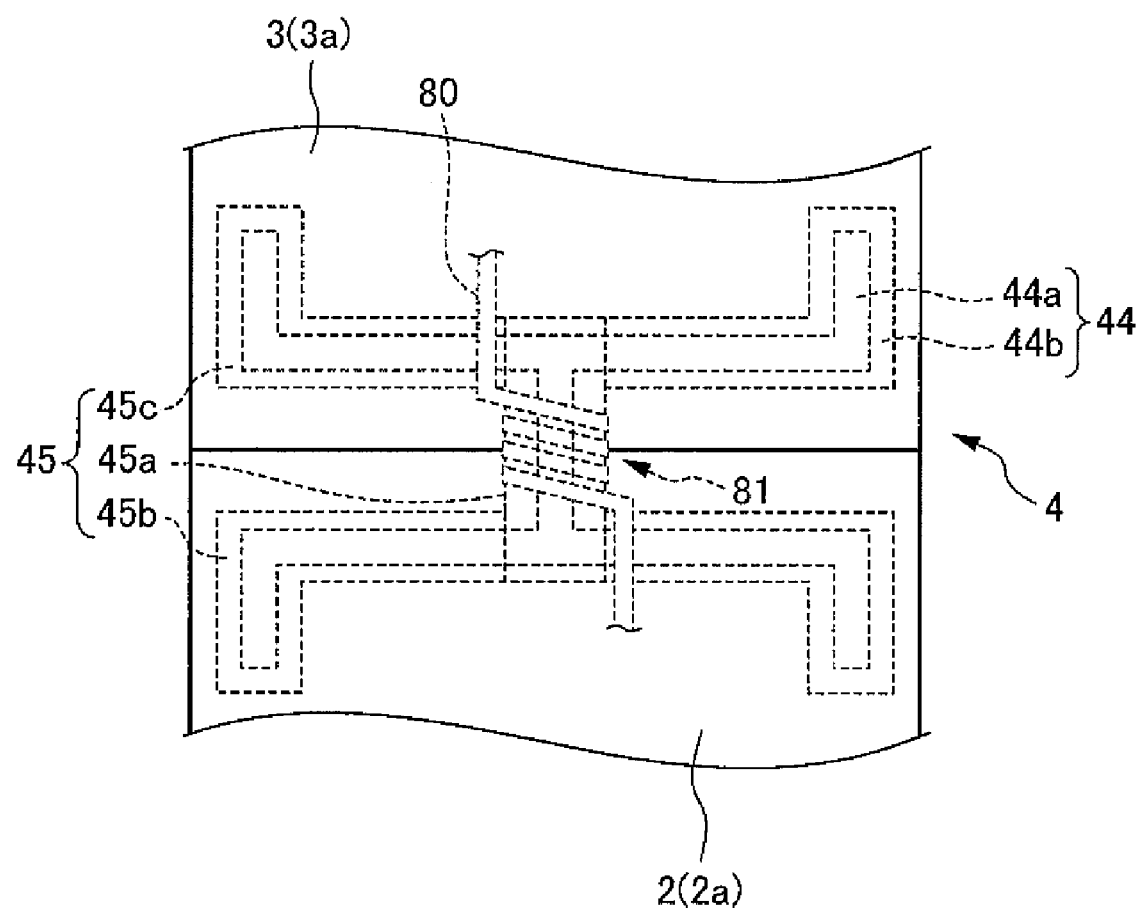
FIG. 13 is a schematic diagram partially showing the vicinity of the connecting portion in the cellular phone device of the third embodiment of the present invention in the opened state.
Figure 14A:
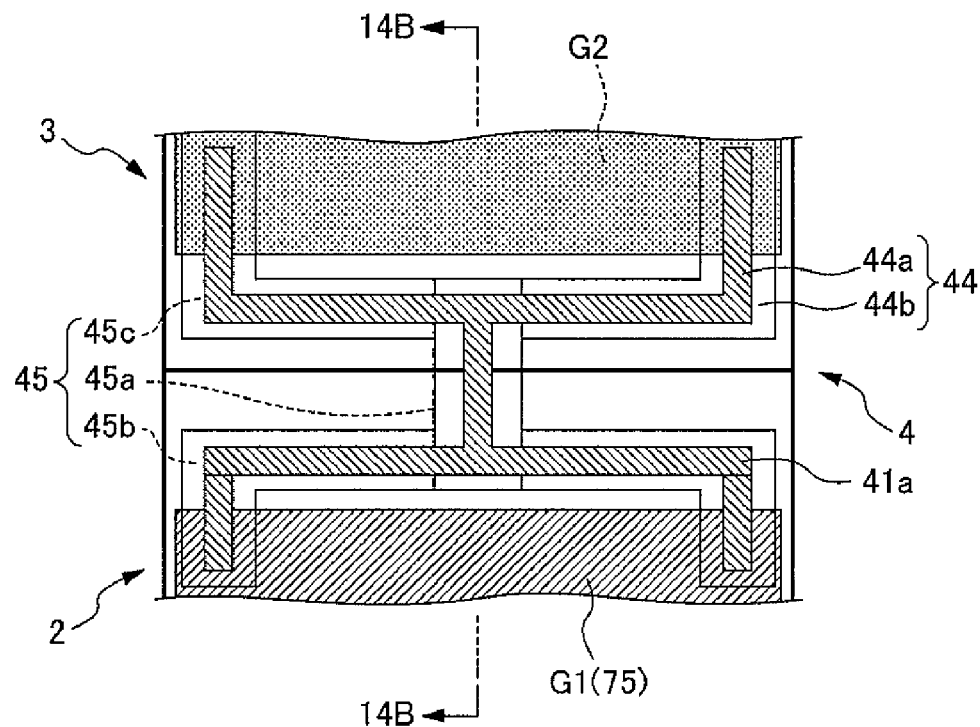
FIGS. 14A and 14B are diagrams schematically showing an electrical connecting relationship among the shaft center members, the reference potential portion of the operation unit side body, and the reference potential portion of the display unit side body, regarding the cellular phone device of the third embodiment according to the present invention in the opened state.
Figure 14B:
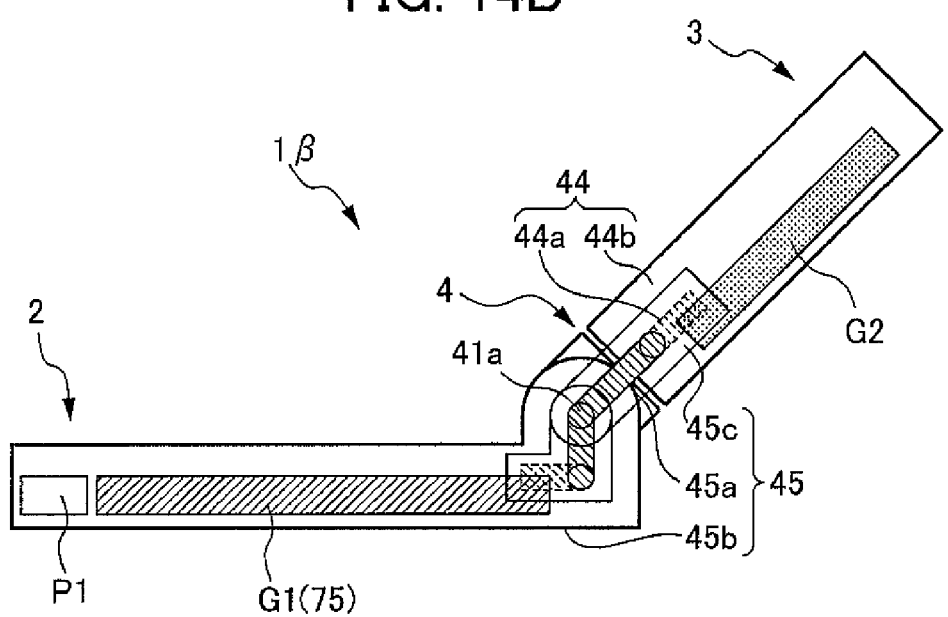

FIG. 11 is a perspective view of the cellular phone device 1β of the third embodiment shown in the opened state. FIG. 12 is a perspective view of the cellular phone device 1β in a state in which the display unit side body 3 is pivoted at a predetermined angle around a pivot axis Y of the connecting portion 4. FIG. 13 is a schematic diagram partially showing the vicinity of the connecting portion 4 in the cellular phone device 1β in the opened state (the diagram corresponding to FIG. 5). FIGS. 14A and 14B are diagrams schematically showing an electrical connection relationship among the shaft center members 41a, the reference potential portion G1 of the operation unit side body 2, and the reference potential portion G2 of the display unit side body 3, regarding the cellular phone device 1β in the opened state (the diagrams respectively corresponding to FIGS. 8A and 8B). FIG. 14A is a partial diagram of the vicinity of the connecting portion 4 viewed from the thickness direction of the operation unit side body 2 and the display unit side body 3. FIG. 14B is a cross-sectional view along a line 14B-14B in FIG. 14A.

As shown in FIGS. 11 and 12, in the cellular phone device 1β of the third embodiment, the operation unit side body 2 and the display unit side body 3 are connected via the connecting portion 4, which is provided with a biaxial hinge mechanism.

Accordingly, the operation unit side body 2 and the display unit side body 3 can be changed to the opened state and the closed state, and it is also possible to change the display unit side body 3 to a front side state and a back side state in the opened state and the closed state, respectively.

In other words, the connecting portion 4 connects the display unit side body 3 and the operation unit side body 2 so as to be openable and closable around an opening-and-closing axis X at an arbitrary angle, and is provided with a biaxial hinge mechanism that connects the display unit side body 3 and the operation unit side body 2 so as to be pivotable around a pivot axis Y at an arbitrary angle. The pivot axis Y is orthogonal to the opening-and-closing axis X.

Here, the front side state in the opened state refers to a state in which the main display unit 34a disposed on the front face 3a of the display unit side body 3 and the operation key group 11 disposed on the front face 2a of the operation unit side body 2 are arranged to face the same side (see FIG. 11). The back side state in the opened state refers to a state in which the main display unit 34a in the display unit side body 3 and the operation key group 11 in the operation unit side body 2 are arranged to face the opposite side (not shown).

Moreover, the front side state in the closed state refers to a state in which the main display unit 34a in the display unit side body 3 and the operation key group 11 in the operation unit side body 2 are arranged to face each other (not shown). Moreover, the back side state in the closed state refers to a state in which the main display unit 34a in the display unit side body 3 is arranged to be exposed without facing the operation key group 11 in the operation unit side body 2 (not shown).

As shown in FIGS. 13, 14A and 14B, in the third embodiment, the operation unit side body 2 and the display unit side body 3 are connected via a hinge frame 44. The hinge frame 44 implements the biaxial hinge mechanism, in which the operation unit side body 2 and the display unit side body 3 are opened and closed in the direction of the opening-and-closing axis X, and are pivoted in the direction of the pivot axis Y. The hinge frame 44 is provided with a first member 45a that extends between the operation unit side body 2 and the display unit side body 3 in the longitudinal direction of the cellular phone device 1β; a second member 45b for connecting the first member 45a and the operation unit side body 2; and a third member 45c for connecting the first member 45a and the display unit side body 3.

The first member 45a, the second member 45b and the third member 45c consist of a shaft center member 44a (first metallic portion) and a covering member 44b (intermediate member) for covering the shaft center member 44a, as in the case of the hinge shaft members 41 in the first embodiment.

The signal line 80 is wound around the first member 45a of the hinge frame 44. In detail, the signal line 80 is wound around the shaft center member 44a via the covering member 44b in the first member 45a, thereby forming the coil 81. It should be noted that, although not shown, the signal line 80 may be wound around the shaft center member 44a over the covering member 44b in the second member 45b and third member 45c, thereby forming the coil 81.

As shown in FIGS. 14A and 14B, in the connecting portion 4, the shaft center member 44a in the second member 45b of the hinge frame 44 is electrically connected to the reference potential portion G1 in the operation unit side body 2. Moreover, the shaft center member 44a in the third member 45c of the hinge frame 44 is electrically connected to the reference potential portion G2 in the display unit side body 3. Thus, the reference potential portion G1 in the operation unit side body 2 and the reference potential portion G2 in the display unit side body 3 are electrically connected via the shaft center member 44a in the hinge frame 44.

In the cellular phone device 1β of the third embodiment as well, effects similar to those in the cellular phone device 1 of the first embodiment and the cellular phone device 1α of the second embodiment are achieved.

Although the embodiments of the present invention have been described above, the present invention is not limited to the aforementioned embodiments, and alterations are possible as appropriate.

For example, although the signal line 80 is wound around the first metallic portion (the shaft center members 41a and 44a) via the intermediate member (the covering members 41b and 44b) in the aforementioned embodiments, it is not limited thereto, and the signal line 80 may be wound around the first metallic portion directly (without the intermediate member).

The first metallic portion may be electrically connected to one or both of the reference potential portion in the first body and the reference potential portion in the second body.

The antenna and the second metallic portion may be disposed to one or both of the first body and the second body.

Moreover, instead of the flip type in the aforementioned embodiments, the electronic device according to the present invention may be an electronic device of a slider type, in which one of the bodies slides to one direction in a state in which the operation unit side body 2 and the display unit side body 3 are mutually superimposed. Moreover, it may be an electronic device of a rotating (revolver) type, in which one of the bodies rotates around an axis line along the direction of superimposing the operation unit side body 2 and the display unit side body 3.

The present invention can be applied to a portable electronic device other than a cellular phone device, and can also be applied to an electronic device other than the portable electronic device. Examples of the portable electronic device other than the cellular phone device include PHS (registered trademark: Personal Handyphone System), a portable gaming machine, a portable navigation system, a PDA (Personal Digital Assistant), a notebook PC, and an EL display or a liquid crystal display provided with an operation unit.

Examples of the electronic device other than the portable electronic device include an electronic dictionary, a calculator, a personal organizer, a digital camera, a video camera, a radio and the like; however, the examples are not limited thereto.

What is claimed is:

1. An electronic device comprising: a first body; a second body; a connecting portion that connects the first body and the second body, and has a first metallic portion; a first circuit board that is disposed inside the first body; a second circuit board that is disposed inside the second body; and a signal line that electrically connects the first circuit board and the second circuit board via the connecting portion, wherein the signal line is wound around the first metallic portion; and wherein the signal line is wound around the first metallic portion via an intermediate member, where the intermediate member is between the signal line and the first metallic portion.

2. The electronic device according to claim 1, wherein the first metallic portion is electrically connected to a reference potential portion.

3. The electronic device according to claim 1, wherein at least a portion of the intermediate member comprises a magnetic material.

4. The electronic device according to claim 1, wherein
the first body and the second body are connected via the connecting portion so as to be openable and closable, the electronic device comprising:
an antenna that is disposed to at least one of the first body and the second body; and
a second metallic portion that is provided to at least one of the first body and the second body, and is disposed so as to be capacitively coupled to the first metallic portion in an opened state in which the first body and the second body are opened via the connecting portion.

5. The electronic device according to claim 4, wherein the first metallic portion is a shaft center member in the connecting portion, and the signal line is wound around the shaft center member via a covering member that covers a peripheral face of the shaft center member, thereby forming a coil.

6. The electronic device according to claim 4, comprising:
a reference potential portion disposed in at least one of the first body and the second body; and a conductive portion that electrically connects the reference potential portion and the shaft center member.

* * * * *